(12) United States Patent
Thiery

(10) Patent No.: US 7,463,468 B2
(45) Date of Patent: Dec. 9, 2008

(54) REVERSE CIRCULATION PROTECTION CIRCUIT

(75) Inventor: Vincent Thiery, Provence (FR)

(73) Assignee: International Rectifier Corporation, El Segundo, CA (US)

( * ) Notice: Subject to any disclaimer, the term of this patent is extended or adjusted under 35 U.S.C. 154(b) by 526 days.

(21) Appl. No.: 10/844,763

(22) Filed: May 12, 2004

(65) Prior Publication Data

US 2005/0083625 A1    Apr. 21, 2005

Related U.S. Application Data

(60) Provisional application No. 60/477,420, filed on Jun. 10, 2003, provisional application No. 60/470,476, filed on May 14, 2003.

(51) Int. Cl.
*H02H 3/00*    (2006.01)
*H02B 1/24*    (2006.01)

(52) U.S. Cl. ............................. 361/82; 361/84; 307/127

(58) Field of Classification Search .................. 361/82, 361/84; 307/127
See application file for complete search history.

(56) References Cited

U.S. PATENT DOCUMENTS 4,992,683 A * 2/1991 Robin, Jr. .................... 327/432
6,650,520 B2 * 11/2003 He .............................. 361/84

FOREIGN PATENT DOCUMENTS

JP    6-129337    5/1994

JP    06-129337    * 10/1994   .................. 361/82

OTHER PUBLICATIONS

Nomura Manabu; Publication No. 06-129337; Glow Plug Control Unit; May 10, 1994; Abstract, Drawing 1.*
Official Notice of Rejection mailed Jul. 7, 2006 from Japanese Patent Office with English language translation.

* cited by examiner

*Primary Examiner*—Stephen W. Jackson
*Assistant Examiner*—Dharti H Patel
(74) *Attorney, Agent, or Firm*—Ostrolenk, Faber, Gerb & Soffen, LLP

(57) ABSTRACT

A circuit for protection against reverse circulation of current through the body diode of an FET power switching device switching a load, the power switching device having gate, source and drain terminals, wherein the power switching device is connected in series with the load, the load being connected to the source or drain terminal of the power switching device, the load being capable of providing a voltage across the source and drain terminals sufficient to cause the body diode to conduct, the power switching device being controlled by a driver output stage having a driver output stage body diode, the driver output stage having a substrate set at a substrate voltage level, the reverse circulation protection circuit comprising a circuit for changing the substrate voltage level of the driver output stage so that the voltage across the driver output stage body diode is less than a voltage sufficient to cause the driver output stage body diode to conduct, thereby allowing the power switching device to pass the reverse circulation current and preventing the body diode of the power switching device from conducting.

16 Claims, 2 Drawing Sheets

REVERSE CIRCULATION PROTECTION CIRCUIT

CROSS REFERENCE TO RELATED APPLICATION

This application claims the priority and benefit of U.S. Provisional Application Ser. No. 60/477,420, filed Jun. 10, 2003 entitled IMPROVED METHOD TO REMOTELY SENSE THE TEMPERATURE OF A POWER SEMICONDUCTOR IN PARTICULAR OF A POWER MOS DEVICE and U.S. Provisional Application Ser. No. 60/470,476 filed May 14, 2003 entitled CURRENT SENSING DRIVER OPERABLE IN LINEAR AND SATURATED REGIONS, the entire disclosures of each of which are incorporated by reference herein.

BACKGROUND OF THE INVENTION

The present invention relates to power switches, and in particular to power semi-conductor switches switching a load and, more particularly, to a circuit for preventing the reverse circulation of current in the body diode of power switches employing field effect transistors as the power switching devices.

In typical power switches as shown in FIG. 1, a power switch 10 comprising a MOSFET switches a load 20, for example, a motor. The power switch 10 includes the MOSFET portion 10A and a body diode 10B. The power switch 10 is driven by a driver 15. In a typical automotive application, the power switch switches the battery voltage VDD across the load 20, as shown in FIG. 1. It is possible that the load, for example a motor, may operate to produce a back EMF, for example, if the motor acts as a generator, which is higher than the battery voltage VDD. In such cases, a reverse current indicated by R will flow in the circuit through the body diode 10B of the FET power switch if the power switch is off because a body diode 15B which is contained in the driver output stage transistor 15A will conduct. The driver stage is typically tied to a substrate voltage S2 which can float about the voltage Vss. As a result, if the voltage S2 reaches a voltage that is 0.6V above VDD, the body diode 15B will conduct, causing power switch 10 to be off, and allowing a reverse circulation current to flow in body diode 10B of power switch 10. This causes greater heating than would occur through the power MOSFET in parallel with the body diode, and may damage the MOSFET.

SUMMARY OF THE INVENTION

It is an object of the present invention to prevent the reverse circulation of currents through the body diode of a power switch comprising a MOSFET.

The objects of the invention are achieved by a circuit for protection against reverse circulation of current through the body diode of an FET power switching device switching a load, the power switching device having gate, source and drain terminals, wherein the power switching device is connected in series with the load, the load being connected to the source or drain terminal of the power switching device, the load being capable of providing a voltage across the source and drain terminals sufficient to cause the body diode to conduct, the power switching device being controlled by a driver output stage having a driver output stage body diode, the driver output stage having a substrate set at a substrate voltage level, the reverse circulation protection circuit comprising a circuit for changing the substrate voltage level of the driver output stage so that the voltage across the driver output stage body diode is less than a voltage sufficient to cause the driver output stage body diode to conduct, thereby allowing the power switching device to pass the reverse circulation current and preventing the body diode of the power switching device from conducting.

According to another aspect, the invention comprises a circuit for protection against reverse circulation of current through the body diode of an FET power switching device switching a load, the power switching device having gate, source and drain terminals, wherein the power switching device is connected in series with the load, the load being connected to the source terminal of the power switching device, the load being capable of providing a voltage on the source terminal greater than the voltage on the drain terminal, the power switching device being controlled by a driver output stage having a driver output stage body diode, the driver output stage having a substrate set at a substrate voltage level, the reverse circulation protection circuit comprising a circuit for reducing the substrate voltage level of the driver output stage so that the voltage across the driver output stage body diode is less than a voltage sufficient to cause the driver output stage body diode to conduct, thereby allowing the power switching device to pass the reverse circulation current and preventing the body diode of the power switching diode from conducting.

Other features and advantages of the present invention will become apparent from the following description of the invention which refers to the accompanying drawings.

BRIEF DESCRIPTION OF THE DRAWING(S)

The invention will now be described in greater detail in the following detailed description with reference to the drawings in which.

DETAILED DESCRIPTION OF THE INVENTION

Figure 1:
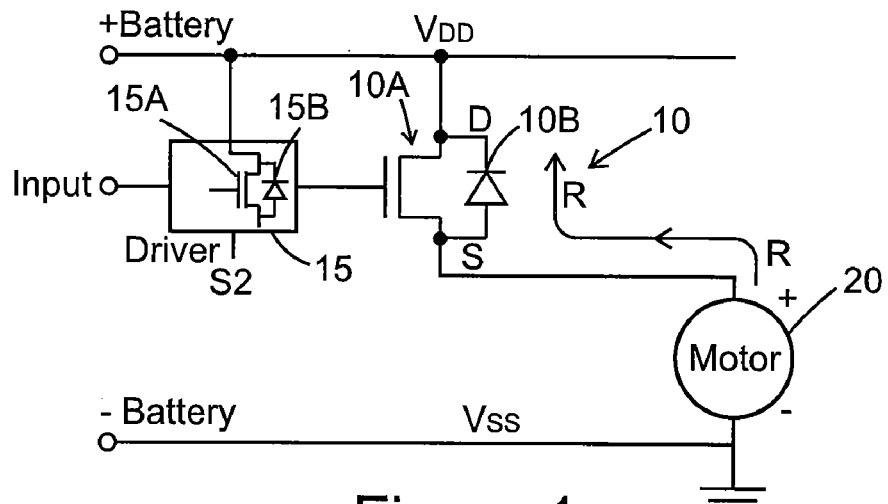
FIG. 1 show a prior art circuit showing how a reverse current can circulate in a power switch.
Figure 2:
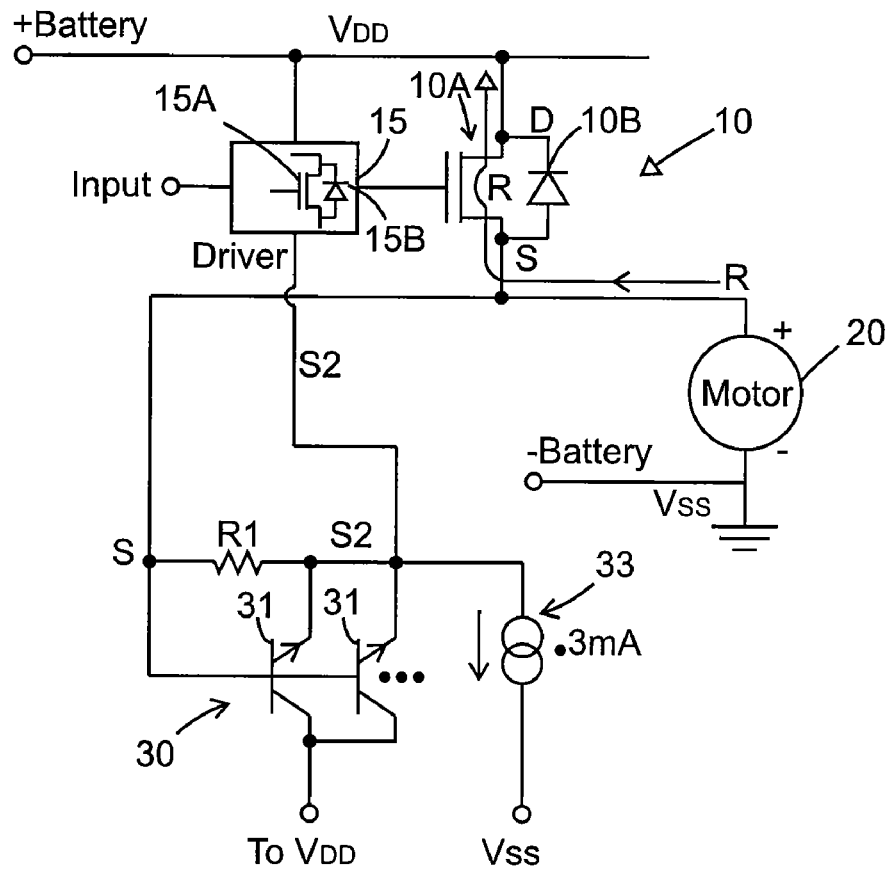
FIG. 2 shows the circuit according to the invention which eliminates the reverse current through the body diode of the power switch.

With reference to FIG. 2, the power switch 10 is connected to the load comprising, for example, a motor 20, as shown. Also connected to the circuit is a current source circuit 30 comprising one or more transistors, for example bipolar transistors 31 having their base or bases commonly connected to the sources of the power switch 10. The emitter or emitters of the transistors 31 are connected to the base or bases via a resistor R1. The collector or collectors of the transistors 31 are coupled to the supply voltage VDD. The emitters are connected through a current source 33 either to voltage source VSS or another potential which is near ground potential.

Driver 15 has an output stage 15A that typically comprises a MOSFET having a body diode 15B. Body diode 15B will conduct if the driver stage substrate (S2) reaches 0.6V over VDD. This is because the n+ nodes are shorted to VDD by a parasitic bipolar transistor present in the MOSFET.

Figure 4:
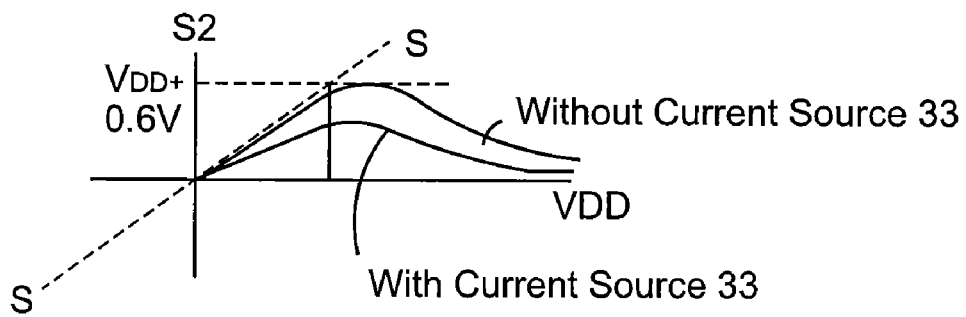
FIG. 4 shows waveforms for explaining the circuit of FIG. 2.

In operation, if the load provides a back EMF or other potential higher than the battery voltage VDD, the body diode 15B does not conduct because transistors 31 turn on pulling the substrate S2 terminal voltage of the driver 15 toward the VDD voltage level, thereby preventing a reverse current in the body diode 15B of the driver. The substrate S2 voltage is reduced as shown in FIG. 4. Current source 33 sinks enough current from the substrate S2 to ensure this and thus to prevent the body diode 15B from conducting. Typically, the currents that are sinked by the current source 33 will be in the range of fractions of milliamps, enough current to prevent the body diode 15B from conducting.

The reverse circulation current (R) from the load 20 is thus free to circulate through the turned on power switch 10, as shown in FIG. 2, but does not circulate in the body diode 10B.

Figure 3:
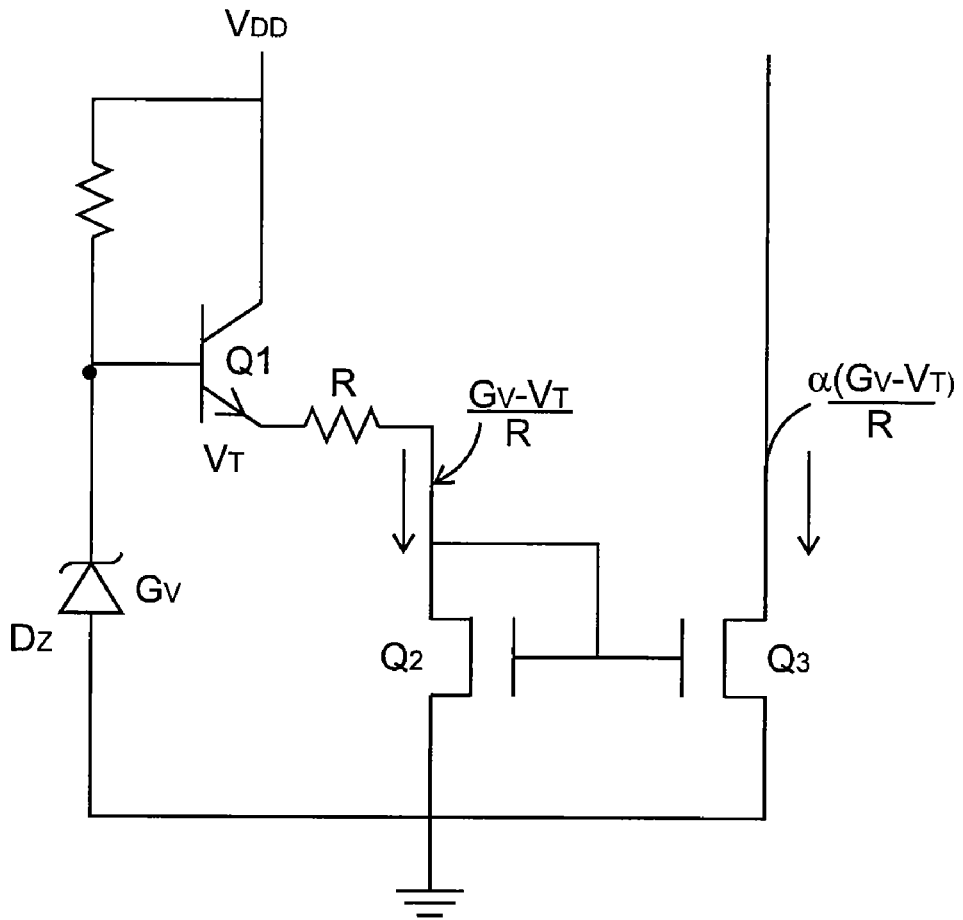
FIG. 3 shows a current source usable in the circuit of FIG. 2.

FIG. 3 shows an example of the current source circuit 33. The current (Gv−Vt)/R, where Gv is the voltage across the zener diode Dz and Vt is the threshold voltage of the bipolar transistor Q1, flows in resistor R. The current mirror comprising transistors Q2 and Q3 produces a current ∝(Gv−Vt)/R in the drain-source path of transistor Q3.

FIG. 4 shows the voltage S2 on the substrate of the driver 15 without and with the current source 33. As shown, the current source reduces the voltage on S2 to prevent body diode 15B of the driver 15 from conducting and allowing the driver to turn on power switch 10 to absorb the reverse circulation current R from the load.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. A circuit for protection against reverse circulation of current through the body diode of an FET power switching device switching a load, the power switching device having gate, source and drain terminals, wherein the power switching device is connected in series with the load, the load being connected to the source or drain terminal of the power switching device, the load being capable of providing a voltage across the source and drain terminals sufficient to cause the body diode to conduct, the power switching device being controlled by a driver output stage having a driver output stage body diode, the driver output stage having a substrate set at a substrate voltage level, the reverse circulation protection circuit comprising a circuit for changing the substrate voltage level of the driver output stage so that the voltage across the driver output stage body diode is less than a voltage sufficient to cause the driver output stage body diode to conduct, thereby allowing the power switching device to pass the reverse circulation current and preventing the body diode of the power switching device from conducting.

2. A circuit for protection against reverse circulation of current through the body diode of an FET power switching device switching a load, the power switching device having gate, source and drain terminals, wherein the power switching device is connected in series with the load, the load being connected to the source terminal of the power switching device, the load being capable of providing a voltage on the source terminal greater than the voltage on the drain terminal, the power switching device being controlled by a driver output stage having a driver output stage body diode, the driver output stage having a substrate set at a substrate voltage level, the reverse circulation protection circuit comprising a circuit for reducing the substrate voltage level of the driver output stage so that the voltage across the driver output stage body diode is less than a voltage sufficient to cause the driver output stage body diode to conduct, thereby allowing the power switching device to pass the reverse circulation current and preventing the body diode of the power switching device from conducting.

3. A circuit for protection against reverse circulation of current through the body diode of an FET power switching device switching a load, the power switching device having gate, source and drain terminals, wherein the power switching device is connected in series with the load, the load being connected to the source terminal of the power switching device, the load being capable of providing a voltage on the source terminal greater than the voltage on the drain terminal, the power switching device being controlled by a driver output stage having a driver output stage body diode, the driver output stage having a substrate set at a substrate voltage level, the reverse circulation protection circuit comprising a circuit for reducing the substrate voltage level of the driver output stage so that the voltage across the driver output stage body diode is less than a voltage sufficient to cause the driver output stage body diode to conduct, thereby allowing the power switching device to pass the reverse circulation current and preventing the body diode of the power switching device from conducting, wherein the reverse circulation protection circuit comprises a current source coupled to a lower potential voltage level comprising a potential less than the drain terminal voltage; and at least one transistor coupled between the drain terminal voltage of the power switching device and said current source, the current source being coupled to the at least one transistor at a common connection, a resistor being coupled between the common connection of said current source and said at least one transistor and the source terminal of the power switching device; a control terminal of the at least one transistor being coupled to the source terminal.

4. The circuit of claim 3, wherein the at least one transistor comprises a bipolar NPN transistor having its emitter coupled to the current source at the common connection and its collector coupled to the drain terminal voltage, the resistor coupled between the base and the emitter, the base being coupled to the source terminal.

5. The circuit of claim 3, wherein the lower potential voltage level comprises a potential close to or at ground.

6. The circuit of claim 1, wherein the substrate voltage level is maintained by the reverse circulation protection circuit at a voltage level that is less than one diode voltage drop above the drain terminal voltage or less.

7. The circuit of claim 3, wherein the current source sinks adequate current to keep the driver output stage body diode from conducting.

8. The circuit of claim 1, wherein the reverse circulation protection circuit further comprises a current source coupled to a potential voltage level less than the drain terminal voltage.

9. The circuit of claim 8, wherein the reverse circulation protection circuit further comprises at least one transistor coupled between a drain terminal voltage of the power switching device and said current source, the at least one transistor having a control terminal coupled to the source terminal, the current source being coupled to the at least one transistor at a common connection.

10. The circuit of claim 9, wherein the reverse circulation protection circuit further comprises a resistor coupled between the common connection and said at least one transistor.

11. The circuit of claim 8, wherein the current source sinks adequate current to keep the driver output stage body diode from conducting.

12. The circuit of claim 2, wherein the reverse circulation protection circuit further comprises a current source coupled to a potential voltage level less than the drain terminal voltage.

13. The circuit of claim 12, wherein the reverse circulation protection circuit further comprises at least one transistor coupled between the drain terminal voltage of the power switching device and said current source, the at least one transistor having a control terminal coupled to the source terminal, the current source being coupled to the at least one transistor at a common connection.

14. The circuit of claim 13, wherein the reverse circulation protection circuit further comprises a resistor coupled between the common connection of said current source and said at least one transistor.

15. The circuit of claim 12, wherein the current source sinks adequate current to keep the driver output stage body diode from conducting.

16. The circuit of claim 1, further comprising a source for supplying power to the load via the power switching device, wherein the load generates the reverse circulation current.

* * * * *